United States Patent
Nakazawa (10) Patent No.: US 8,592,939 B2
(45) Date of Patent: Nov. 26, 2013

(54) SEMICONDUCTOR DEVICE AND MANUFACTURING METHOD THEREOF

(75) Inventor: Keisuke Nakazawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 214 days.

(21) Appl. No.: 13/233,771

(22) Filed: Sep. 15, 2011

(65) Prior Publication Data

US 2012/0193596 A1 Aug. 2, 2012

(30) Foreign Application Priority Data

Jan. 27, 2011 (JP) .................. 2011-015596

(51) Int. Cl.
 *H01L 21/70* (2006.01)
(52) U.S. Cl.
 USPC ............ 257/501; 257/E21.546; 438/296; 438/357; 438/424
(58) Field of Classification Search
 USPC ........... 257/501, E21.545, E21.546; 438/296, 438/359, 424
 See application file for complete search history.

(56) References Cited

U.S. PATENT DOCUMENTS 7,262,477 B2 * 8/2007 Okumura et al. ............. 257/510
7,371,657 B2 * 5/2008 Wellhausen et al. .......... 438/430

FOREIGN PATENT DOCUMENTS

| JP | 09-315812 | 12/1997 |
| JP | 2006-310448 | 11/2006 |
| JP | 2009-130139 | 6/2009 |
| JP | 2010-177647 | 8/2010 |

* cited by examiner

*Primary Examiner* — Yu-Hsi D Sun
(74) *Attorney, Agent, or Firm* — Finnegan, Henderson, Farabow, Garrett & Dunner, L.L.P.

(57) ABSTRACT

In accordance with an embodiment, a semiconductor device includes a functional film, first and second trenches, and first and second insulating films. The functional film comprises first and second areas. The first trench is provided in the first area of the functional film and has a first width. The second trench is provided in the second area of the functional film and has a second width larger than the first width. The first insulating film is formed from a polymeric material as a precursor to fill the first trench. The second insulating film has a diameter larger than the first width and is formed from particulates and the polymeric material as precursors. The particulates fill the second trench. The polymeric material fills spaces between the particulates in the second trench and also fills gaps between the particulates and the second trench.

9 Claims, 12 Drawing Sheets

SEMICONDUCTOR DEVICE AND MANUFACTURING METHOD THEREOF

CROSS REFERENCE TO RELATED APPLICATIONS

This application is based upon and claims the benefit of priority from the prior Japanese Patent Application No. 2011-015596, filed on Jan. 27, 2011, the entire contents of which are incorporated herein by reference.

FIELD

Embodiments described herein relate generally to a semiconductor device and manufacturing method thereof.

BACKGROUND

Miniaturization of a semiconductor pattern has been approaching its limit. Accordingly, there have been suggestions for a large number of three-dimensional layouts in which storage elements are not only arranged in a conventional XY plane but also arranged in a Z axis direction. As the storage elements, a ferroelectric random access memory (FeRAM), a magnetoresistive random access memory (MRAM), a phase change random access memory (PRAM), a resistance random access memory (ReRAM), and an organic memory have been devised.

As an example of a method of producing the three-dimensional layout, layers of combinations each comprising a storage element held between an upper electrode and a lower electrode are stacked in the Z axis direction, and n×m storage elements are arranged in the XY plane. Adjacent elements are insulated from each other by embedding an insulating film therebetween. A method to produce a device having such a layout is taken for instance. According to this method, a first storage element and upper and lower electrodes are processed by an L/S pattern, and an insulating film is embedded in spaces. A second L/S pattern is then processed at right angles with the L/S pattern lying immediately under the second L/S pattern, and an insulating film is embedded again.

For the insulating film, it is possible to use silicon dioxide formed by, for example, a chemical vapor deposition (CVD) or a coating method, or a carbon-containing silicon compound which is produced by bonding its organic matter to polysiloxane or silsesquioxane produced by a coating method. These materials are also used as low-k materials, and organic matter such as SILK™ may also be used. Another way used to produce silicon dioxide is to oxidize polysilazane having an Si—N bond.

However, if the number of stacked layers increases, the thickness of the insulating film in the Z axis direction increases, so that cracks are easily caused. In order to avoid this, it is preferable to embed a structurally strong filling material such as silica particulates or colloidal silica. However, when these filling materials are used, the quality of the film is not uniform. Therefore, if lithography is used to create a pattern, the border of the pattern after the processing of the insulating film becomes more uneven than when no filling material is used, so that so-called line edge roughness (hereinafter briefly referred to as "LER") increases. When advancing miniaturization brings a wiring pattern to a nanometer size, the LER greatly could affect the features of semiconductor devices, for example, varies wiring resistance.

DETAILED DESCRIPTION

In accordance with an embodiment, a semiconductor device includes a functional film, first and second trenches, and first and second insulating films. The functional film comprises first and second areas. The first trench is provided in the first area of the functional film and has a first width. The second trench is provided in the second area of the functional film and has a second width larger than the first width. The first insulating film is formed from a polymeric material as a precursor to fill the first trench. The second insulating film has a diameter larger than the first width and is formed from particulates and the polymeric material as precursors. The particulates fill the second trench. The polymeric material fills spaces between the particulates in the second trench and also fills gaps between the particulates and the second trench.

Embodiments will now be explained with reference to the accompanying drawings. Throughout the drawings, like parts are given like reference numbers, and repeated explanations are given only when necessary.

(1) First Embodiment

(a) Semiconductor Device

Figure 1:
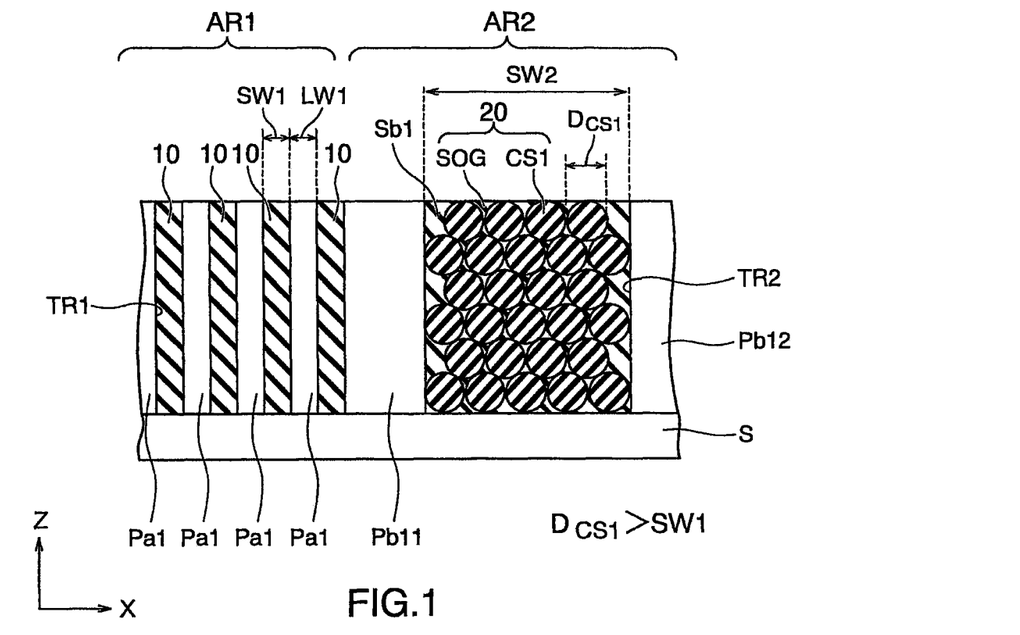
FIG. 1 is a schematic sectional view showing essential parts of a semiconductor device according to a first embodiment.
Figure 2:
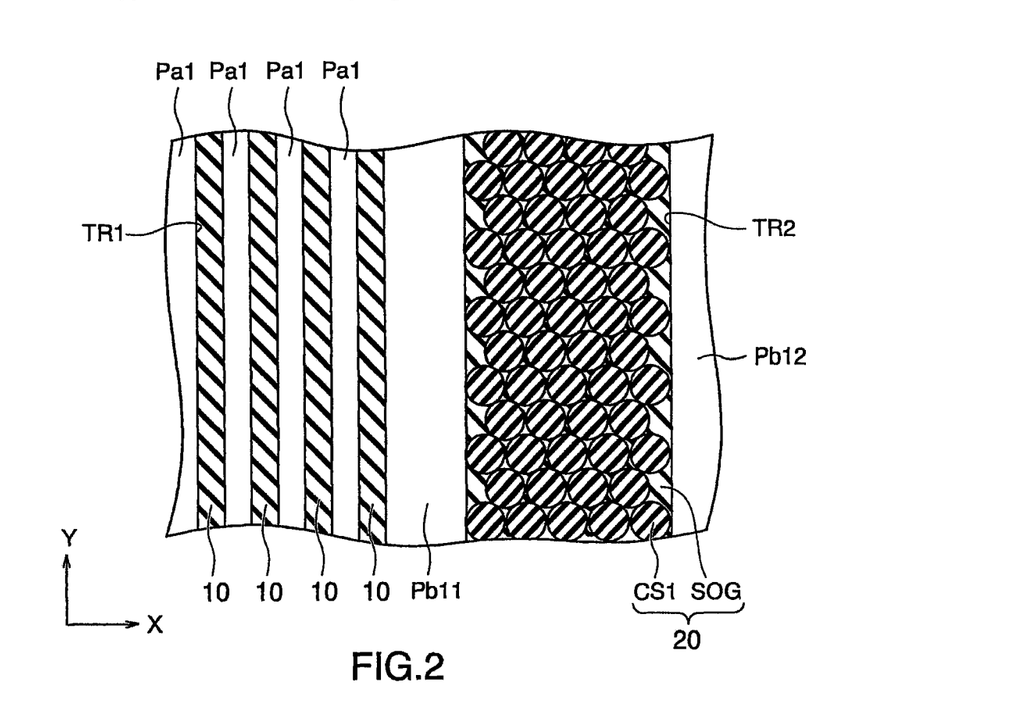
FIG. 2 is a plan view of the semiconductor device shown in FIG. 1.

FIG. 1 is a schematic sectional view showing essential parts of a semiconductor device according to a first embodiment. FIG. 2 is a plan view of the semiconductor device shown in FIG. 1. The semiconductor device shown in FIG. 1 and FIG. 2 comprises a line-and-space (hereinafter briefly referred to as "L/S") pattern formed in an area AR1 of a substrate S, and a space pattern Sb1 formed in an area AR2 of the substrate S.

In the area AR1, a line pattern Pa1 having a width LW1 which comprises, for example a metal wiring material or a storage element, and an insulating film 10 embedded in a space pattern Sa1 comprising a trench TR1 having a width SW1 alternate in, for example, an X direction, thereby constituting the L/S pattern. In the present embodiment, the width LW1 and the width SW1 are, for example, 10 to 20 nm. The insulating film 10 is formed by a polymer, in the present embodiment, spin on glass (SOG) as a precursor.

In the present embodiment, the substrate S corresponds to, for example, a functional film, the trench TR1 corresponds to, for example, a first trench, and the width SW1 corresponds to, for example, a first width. Moreover, in the present embodiment, the area AR1 corresponds to, for example, a first area, and the insulating film 10 corresponds to, for example, a first insulating film.

In the area AR2, there are provided line patterns Pb11 and Pb12, and an insulating film 20 embedded in the space pattern Sb1 comprising a trench TR2 between the line patterns Pb11 and Pb12. The area AR specifically corresponds to a peripheral circuit section. In the present embodiment, a width SW2 of the trench TR2 is, for example, 100 nm or more. The insulating film 20 comprises particulates CS1, and a material which is formed by a polymer, in the present embodiment, SOG as a precursor and which fills an area between the particulates CS1 in the space pattern Sb1 and an area between the Particulates CS1 and the sidewall of the space pattern Sb1.

In the present embodiment, the trench TR2 corresponds to, for example, a second trench, and the width SW2 corresponds to, for example, a second width. Moreover, in the present embodiment, the area AR2 corresponds to, for example, a second area, and the insulating film 20 corresponds to, for example, a second insulating film.

A diameter Dcs1 of the particulate CS1 is larger than the width SW1 of the trench TR1. In the present embodiment, the particulates CS1 are colloidal silica, and its density (mass per unit volume) is 2.2 g/cm³ which is higher than about 1.0 to 2.0 g/cm³ of a material formed by SOG as a precursor. While colloidal silica has crystallinity, the material formed by SOG as a precursor loses crystallinity as a result of a later-described curing process and becomes amorphous. The degree of density and the presence of crystallinity can be easily checked by observing, for example, an interference figure obtained by a transmission electron microscope (TEM).

The ratio O/Si of O to Si is different when Si-based SOG is used. While the O/Si of colloidal silica is 2, the O/Si of SOG is less than 2.

There is no particular limit to devices to which the present embodiment is applied. The present embodiment is applicable to any device having a thin L/S pattern and a wide part. For example, the present embodiment is also applicable to shallow trench isolation (STI) of a nonvolatile memory such as a NAND memory or a DRAM (dynamic random access memory).

(b) Semiconductor Device Manufacturing Method

A method of manufacturing the semiconductor device according to the above embodiment is described with reference to schematic sectional views in FIG. 3 and FIG. 4.

Figure 3:
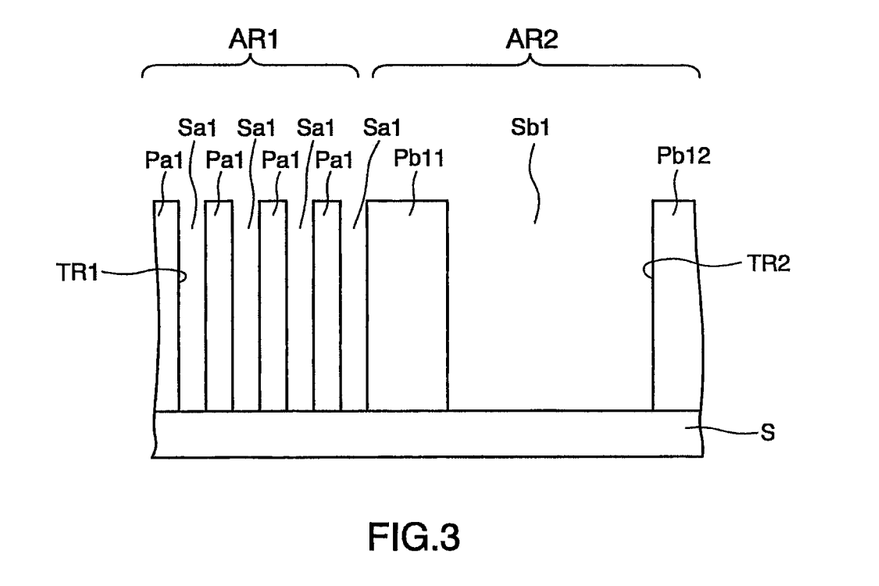
FIGS. 3 and 4 are schematic sectional views illustrating a method of manufacturing the semiconductor device shown in FIG. 1.
Figure 4:
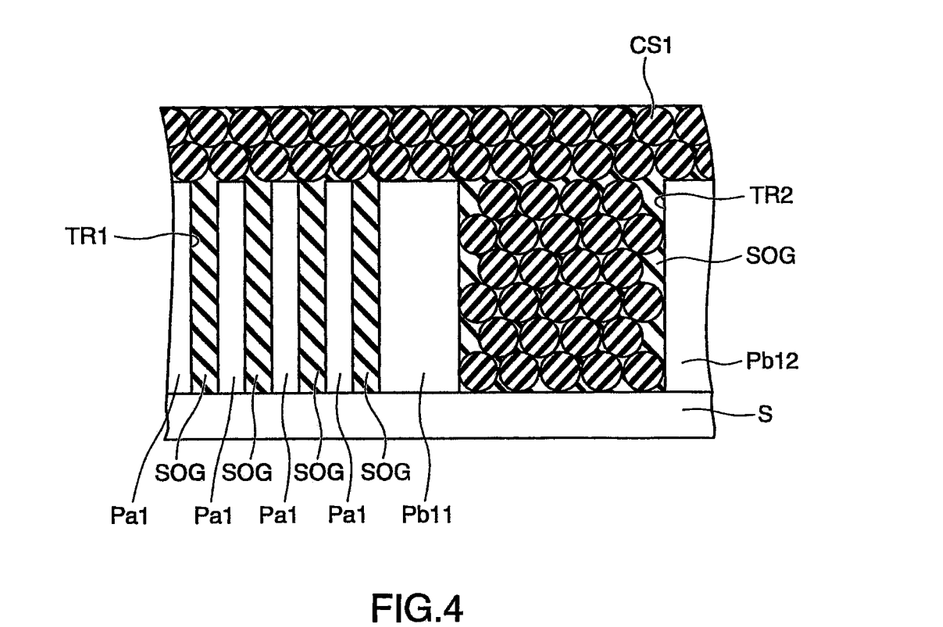

First, as shown in FIG. 3, a trench TR1 having, for example, a width SW1 (10 to 20 nm) is formed in an area AR1 of a substrate S by lithography and etching processing, and a space pattern Sb1 having, for example, a wide space of 100 nm or more is formed in an area AR2 of the substrate S. The width of each space pattern can be reduced if a thin film made of, for example, $SiO_2$ or SiN is formed on the sidewall of the trench by a method such as a CVD method.

The substrate S is then coated with a coating solution in which SOG is mixed with particulates. Both inorganic matter and organic matter may be used as SOG, and one of inorganic matter and organic matter is selected suitably to a purpose.

When a product is exposed to a high temperature of about 300° C. or more in a subsequent manufacturing process, a heat-resistant Si-based material is preferred as the material of SOG. For example, a solution of polysiloxane (n is a natural number)
or silsesquioxane or polysilazane (n is a natural number)
is preferred. Organic SOG in which an organic group is bonded to these materials can also be used. In this case, however, attention has to be paid to the decomposition temperature of the organic group. The decomposition temperature is about 400° C. to about 700° C. depending on materials.

Colloidal silica which is often chemically bonded to SOG is suitably used as the particulates. Colloidal silica is spherical, and its diameter can be selected from several nm to several µm.

In the present embodiment, particulates having a diameter Dcs1 larger than the width SW1 of the trench TR1 in the area AR1 are used (Dcs1>SW1). The coating solution in which SOG is mixed with particulates can be used without limitation, from a solution in which particulates are simply dispersed in an SOG solution to a solution in which SOG and particulates are partly bonded.

A spin coating method is beneficial as a coating method for the coating solution, but does not have to be exclusively used. The substrate S in FIG. 3 is coated with the coating solution that contains SOG and particulates, and SOG in the coating solution enters both the narrow trench TR1 and a wide trench TR2. On the other hand, the diameter Dcs1 of Colloidal silica CS1 used in the coating solution is larger than the width SW1 of the trench TR1 and smaller than a width SW2 of the trench TR2, so that the particulates CS1 do not enter the trench TR1 and can only enter the trench TR2. A condition after the coating is schematically shown in FIG. 4.

After the coating, the solvent in the coating solution is removed by drying to cure a coating film. The coating film may be cured by, for example, a thermal treatment or an oxidation treatment depending on product specifications. As a result, an insulating film is formed by SOG as a precursor or by SOG and the particulates as precursors.

Furthermore, the surface of a substrate in which SOG and the particulates are embedded as precursors in the above process is planarized by chemical mechanical polishing (CMP), thereby providing the semiconductor device shown in FIG. 1 and FIG. 2. It is obvious that the material formed by SOG as a precursor only enters the trench TR1 in the area AR1 and that the material formed by SOG and the particulates as precursors enters the trench TR2 in the area AR2.

(2) Second Embodiment (a) Semiconductor Device

Figure 5:
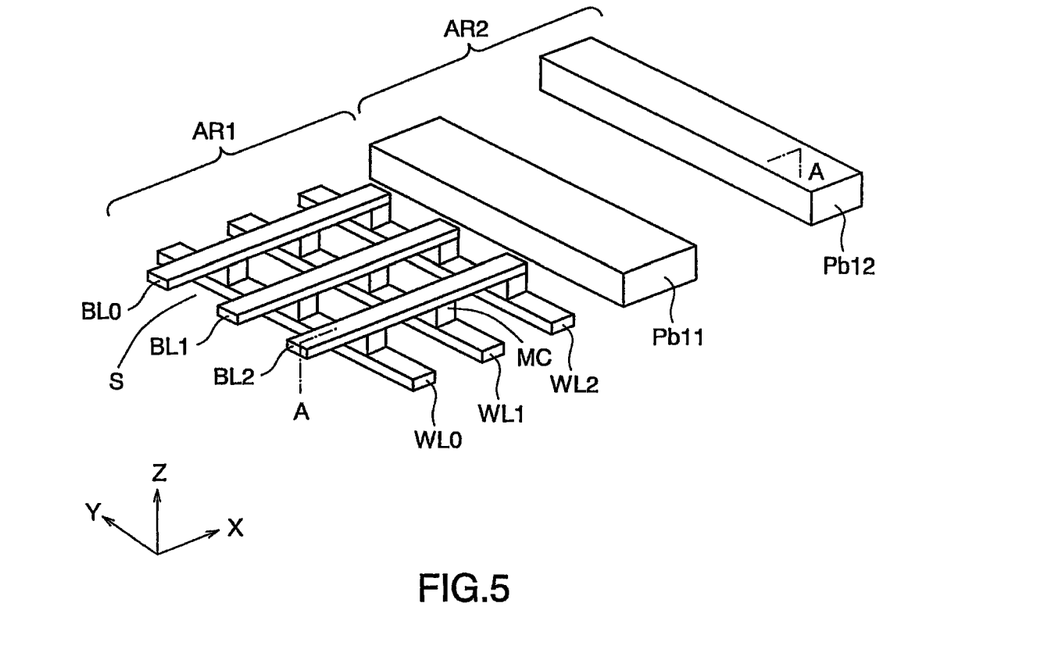
FIG. 5 is a perspective view showing essential parts of a semiconductor device according to a second embodiment.

FIG. 5 is a perspective view showing the basic configuration of a semiconductor device according to a second embodiment. In the present embodiment, the present invention is applied to a nonvolatile semiconductor storage device.

As shown in FIG. 5, word lines WL0 to WL2 are provided parallel to one another as a plurality of first wiring lines in an area AR1 on a substrate S. Bit lines BL0 to BL2 are provided parallel to one another as a plurality of second wiring lines across the word lines WL0 to WL2. Moreover, memory cells MC are arranged between the word lines and the bit lines at their intersections. Heat-resistant materials having a low resistance value, such as W, WSi, NiSi and CoSi can be used as the materials of the first and second wiring lines. An area AR2 on the substrate S serves as a peripheral circuit section. While a one-dimensional configuration having L/S patterns alone is used in the first embodiment, a two-dimensional configuration provided with the bit lines BL, the storage elements MC, and the word lines WL is used in the second embodiment. In the present embodiment, the word lines WL are repetitively arranged in an X direction, and the bit lines are repetitively arranged in a Y direction that intersects with the X direction.

Figure 6:
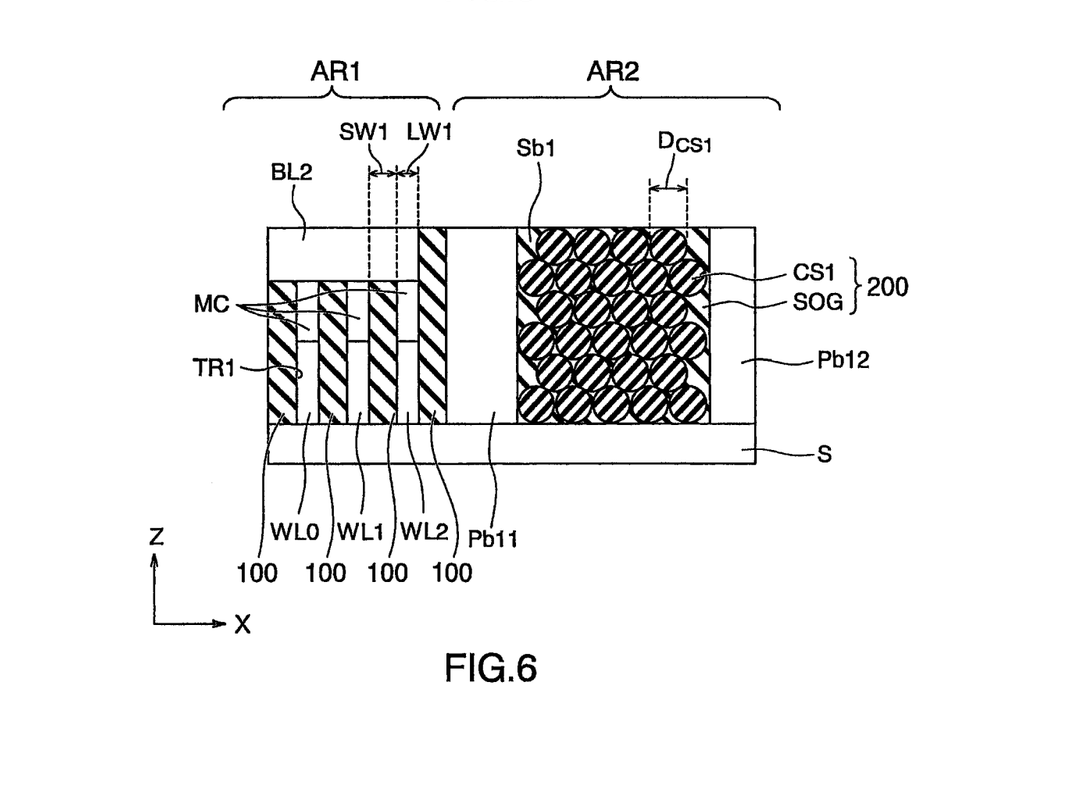
FIG. 6 is a sectional view cut along the A-A line in FIG. 5.

FIG. 6 is a sectional view cut along the A-A line in FIG. 5. As in the first embodiment described above, an insulating film 10 formed by an SOG film having a width SW10 as a precursor is embedded in a space pattern Sa10 between the word lines WL0 to WL2 in the area AR1. There are space patterns between the bit lines BL0 to BL2 in the area AR1 on the near side of the sheet of the drawing and on the other side, and insulating films 100 formed by SOG as a precursor are also embedded in space patterns. A space pattern Sb10 having a width SW20 is embedded in the area AR2, and an insulating film 200 formed by SOG and Colloidal silica CS1 as precursors is embedded therein. A diameter Dcs1 of the Colloidal silica CS1 is larger than the width SW10 of the space pattern Sa10.

(b) Semiconductor Device Manufacturing Method

A method of manufacturing the semiconductor device shown in FIG. 5 is described. This method is substantially similar to that according to the first embodiment described above in the process up to the formation of word lines WL0 to WL2, an insulating film 100, and an insulating film 200. Therefore, how to form bit lines BL0 to BL2 and the insulating film 100 therebetween is described below.

Figure 7:
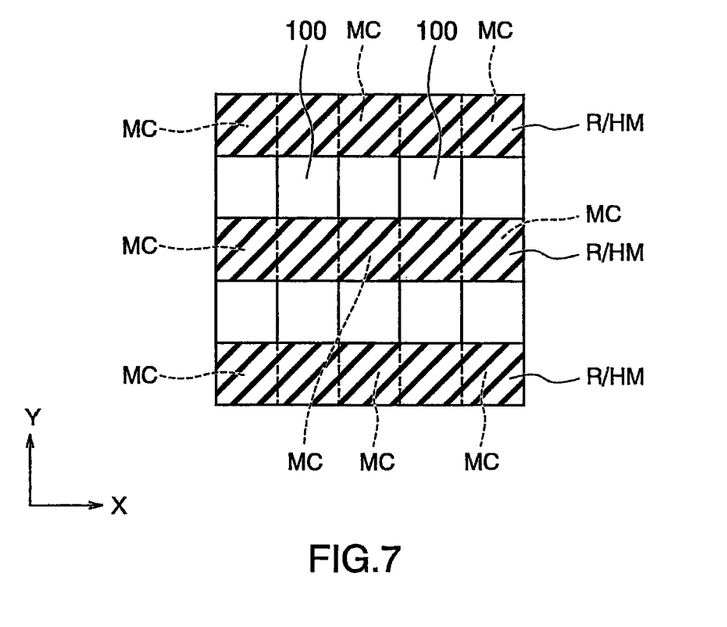
FIGS. 7 and 8 are schematic sectional views illustrating a method of manufacturing the semiconductor device shown in FIG. 5.

That is, first, as shown in FIG. 7, a wiring material is deposited all over, and an L/S pattern to form the bit lines BL0 to BL2 is formed in an area AR1 at right angles with the word lines WL0 to WL2. The location of a resist or a hard mask at this point is indicated by a sign R/HM in FIG. 7.

Figure 8:
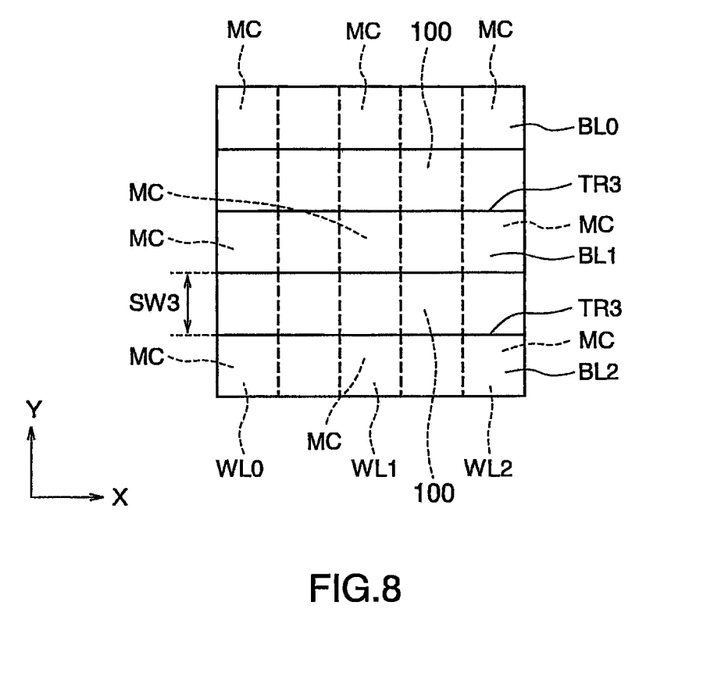

Furthermore, the pattern of the resist or hard mask R/HM is used as a mask for dry etching to reach a surface that is flush with the upper surfaces of the word lines WL0 to WL2, and the resist is detached. FIG. 8 is a top view showing the surface shape after the dry etching. A trench TR3 having a width SW3 is formed in the etched area, and the insulating film 100 formed by SOG as a precursor is embedded in the trench TR3. This etching may reach the bottom of a substrate S depending on product specifications. In the present embodiment, the width SW3 corresponds to, for example, a third width, and the trench TR3 corresponds to, for example, a third trench and is formed across a trench TR1 when viewed in plan. The film formed by SOG as a precursor and the patterns of the word lines WL0 to WL2 may be etched simultaneously or separately. According to the present embodiment, the line edge of the etched film formed by SOG as a precursor is processed so as to cause much less roughness than heretofore.

(3) Comparative Examples

Here, one example of a conventional technique is described as a comparative example.

Figure 9:
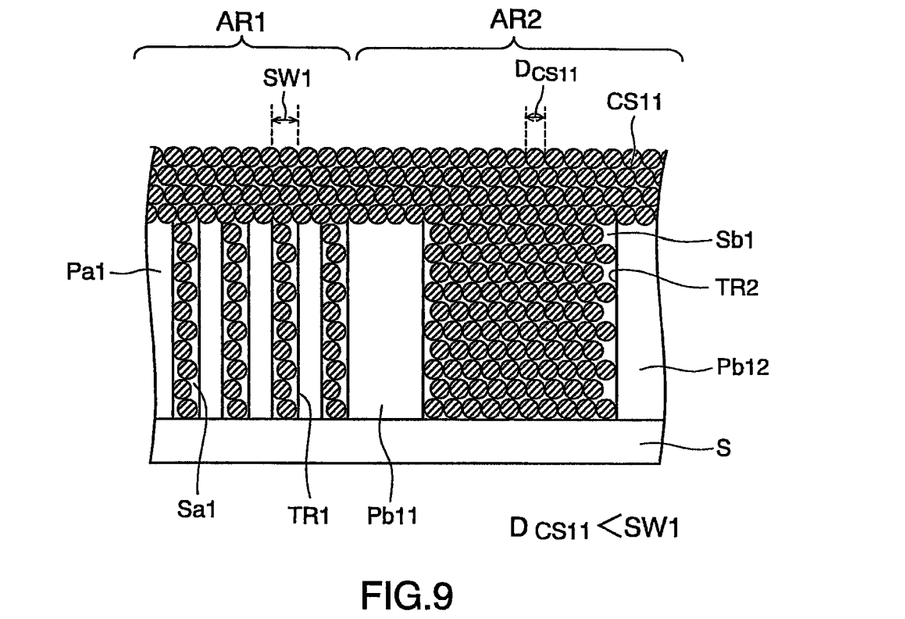
FIGS. 9 and 11 are schematic sectional views illustrating a method of manufacturing a semiconductor device according to a reference example.

For a semiconductor shown in FIG. 9, a coating solution in which particulates CS11 having a diameter Dcs11 smaller than the width SW1 of the space pattern Sa1 in the area AR1 are mixed with SOG is used in a three-dimensional shape similar to that shown in FIG. 1. The method of manufacturing the coating solution is substantially the same as that in the first embodiment described above.

A film formed by SOG as a precursor is embedded in both a trench TR1 of the area AR1 and a trench TR2 of an area AR2 as in the first embodiment. However, in this example, as the diameter Dcs11 of the particulates CS11<the width SW1 of the space pattern Sa1, the particulates CS11 are embedded not only in the trench TR2 but also in the trench TR1 of the area AR1. Moreover, the diameter Dcs11 of the particulates used in the example shown in FIG. 9 is slightly smaller than the width SW1, so that one particulate to several particulates CS11 only enter the space pattern Sa1 in a direction level with the substrate S. In FIG. 9 to FIG. 13, SOG is not hatched for clarity.

Figure 10:
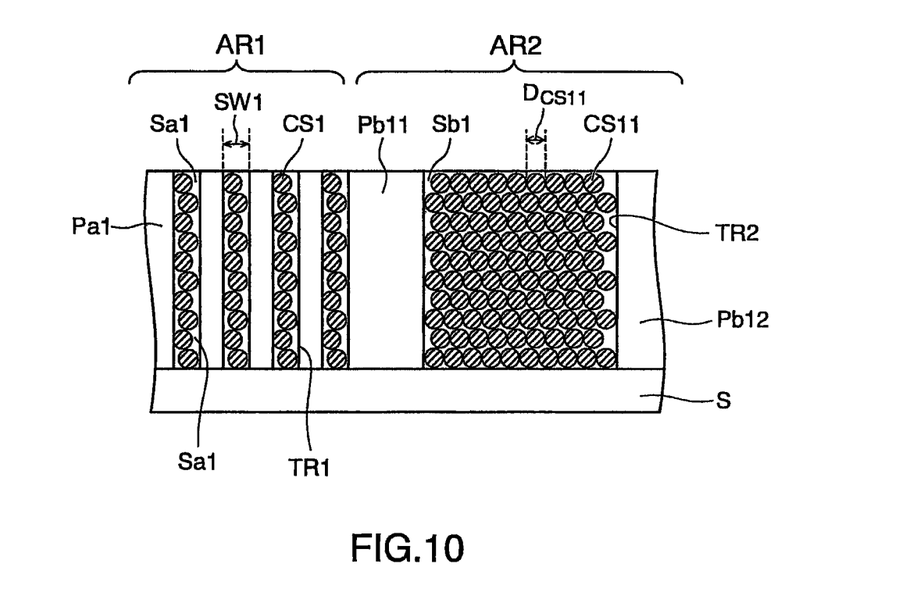
FIGS. 10 and 12 are schematic plan views illustrating the method of manufacturing the semiconductor device according to the reference example.
Figure 11:
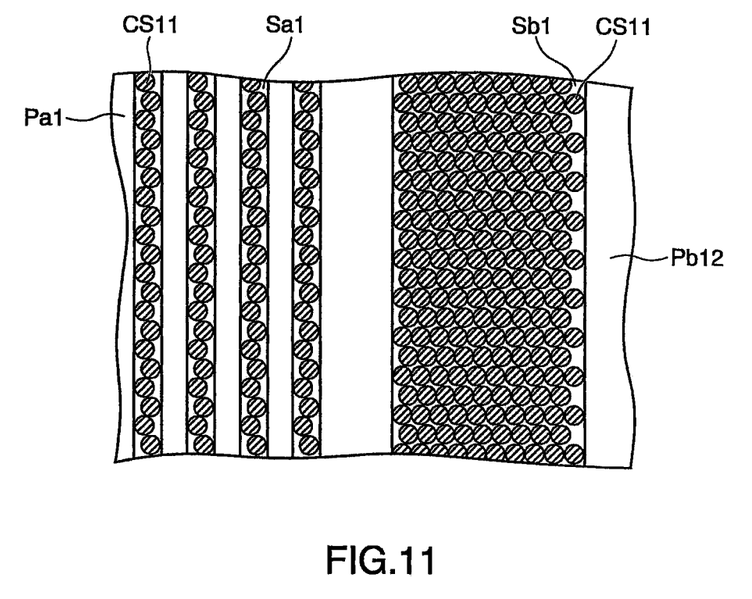

FIG. 10 is a sectional view showing a situation after the surface of the substrate S in which an insulating film formed by the particulates CS11 and SOG as precursors is embedded as described above is planarized by CMP. FIG. 11 is a plan view of a product at the stage of FIG. 10 shown from the upper surface. It is obvious that the insulating film formed by SOG and the particulates CS11 as precursors is contained together with space patterns Sa1 and Sb1.

As in the first embodiment described above, a pattern having the same size as an L/S pattern in the area AR1 is formed by lithography at right angles with the L/S pattern shown in FIG. 10 and FIG. 11.

Figure 12:
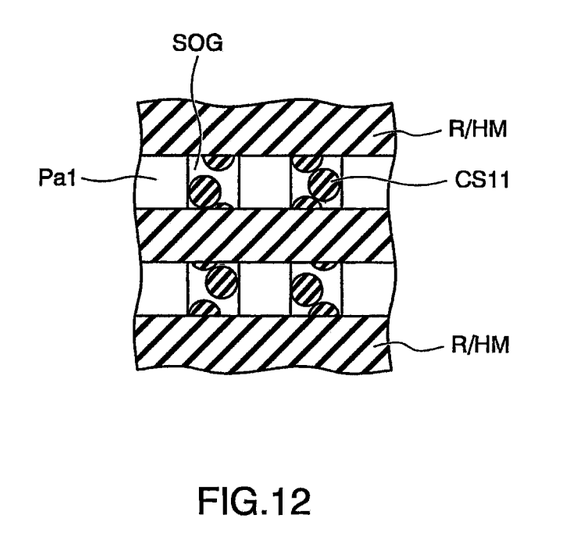
Figure 13:
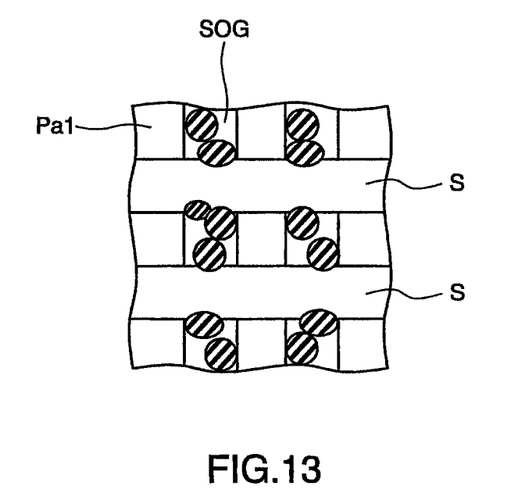
FIG. 13 is a diagram illustrating a problem of the method of manufacturing the semiconductor device according to the reference example.

FIG. 12 shows the layout of a resist or hard mask R/HM in this case. The resist or hard mask R/HM is detached after the resist or hard mask R/HM is used as a mask for dry etching of the surface to reach the bottom of the substrate or a certain point of the pattern. The insulating film formed by SOG and the particulates CS11 as precursors and the L/S pattern may be etched simultaneously or separately. FIG. 13 is a plan view of the product at this stage shown from the upper surface.

As there is a difference of etching rate between the SOG part and the particulate part CS11, the line edges of the SOG part/the particulate part after etched are rougher. In the illustration of FIG. 13, the SOG part and the particulate part CS11 are depicted on the assumption that the etching rate of the SOG part is larger that of the particulate part CS11. The particulate part CS11 lower in etching rate cannot be created as a pattern in alignment with the SOG part, and is misaligned. Such roughness increases with the difference of etching rate between the two parts. When organic matter or organic SOG is used for SOG and colloidal silica is used for the particulates CS11, the difference of etching rate between the SOG part and the Colloidal silica CS11 part may be two times or more, and the roughness increases accordingly.

The influence of the roughness varies depending on what the pattern is used for. For example, when the pattern has wiring lines, the roughness results in a variation in resistance value and significantly affects the reliability of semiconductor products.

As in the second embodiment described above, the roughness appears as a variation in storage density or the like when the pattern constitutes storage elements.

In contrast, according to the first and second embodiments described above, the Colloidal silica CS1, CS11 each having a diameter larger than the width SW1 of the trench TR1 in the area AR1 are used, so that SOG alone fills the space pattern, and the particulates are not embedded in the space pattern. Therefore, a semiconductor device which is significantly low in LER and which has satisfactory device features is provided.

(4) Third Embodiment (a) Semiconductor Device

Figure 14:
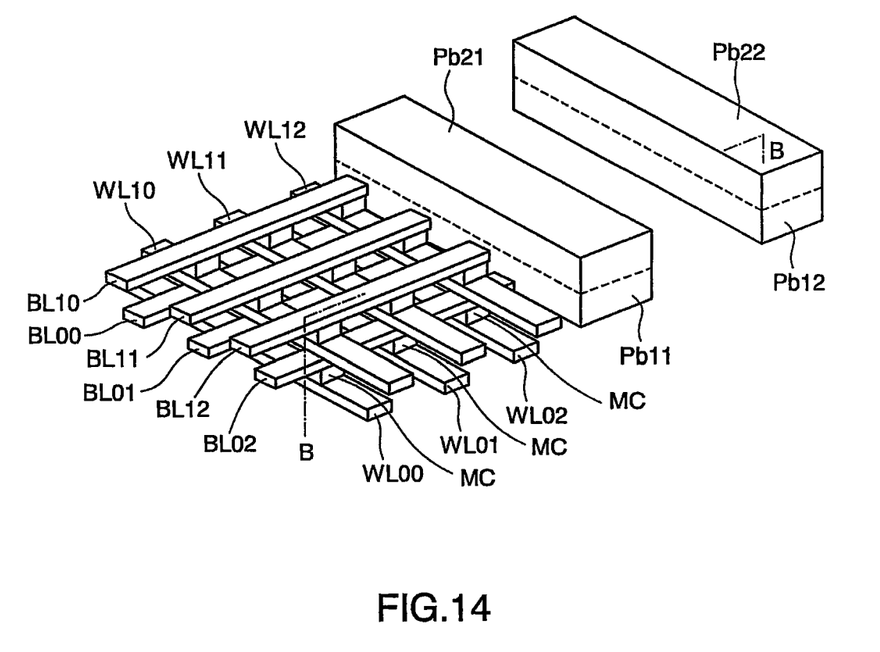
FIG. 14 is a perspective view showing essential parts of a semiconductor device according to a third embodiment.
Figure 15:
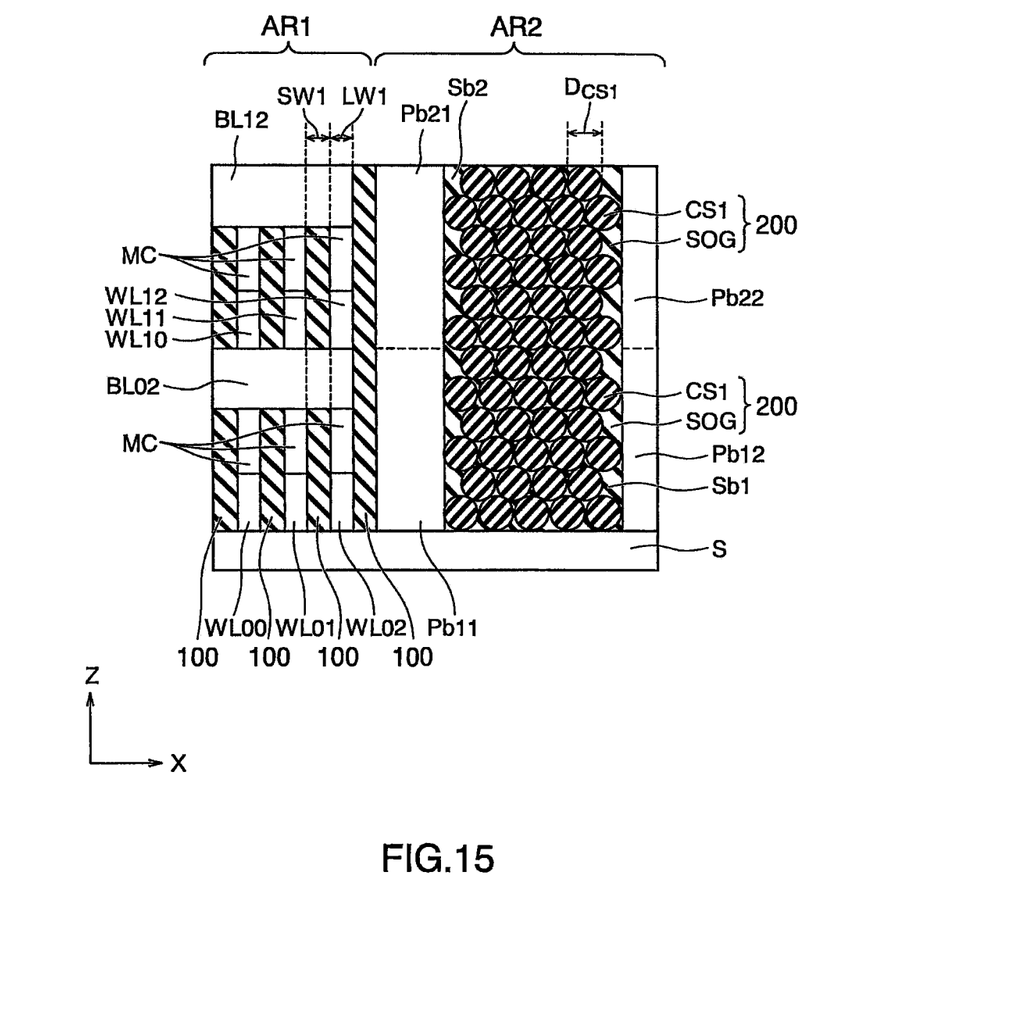
FIG. 15 is a sectional view cut along the B-B line in FIG. 14.

FIG. 14 is a perspective view showing essential parts of a semiconductor device according to a third embodiment. FIG. 15 is a sectional view cut along the B-B line in FIG. 14.

The one-dimensional configuration having L/S patterns alone is used in the first embodiment, and the two-dimensional configuration including the bit lines BL and the word lines WL is used in the second embodiment. In contrast, a three-dimensional configuration in which layers of bit lines BL and word lines WL are stacked is used in the third embodiment. That is, the semiconductor device according to the present embodiment is equivalent to the semiconductor devices shown in FIG. 5 and FIG. 6 that are stacked in the Z direction.

As shown in FIG. 15, in the semiconductor device according to the present embodiment, a line pattern part of an area AR1 comprises a stack of a word line WL00, a memory cell MC, and a bit line BL02 in order from the side of a substrate S. Moreover, an upper layer (second layer) L/S pattern is stacked on a lower layer (first layer) L/S pattern across the lower layer (first layer) L/S pattern when viewed in plan. A line pattern part of the upper layer (second layer) comprises a stack of a word line WL10, a memory cell MC, and a bit line BL12 in order from the side of a substrate S. No active elements such as storage elements are disposed in an area AR2, and the area AR2 is used as, for example, a peripheral circuit section (not shown).

As in the first embodiment, in the area AR1, a first insulating film formed by SOG as a precursor is embedded in the space pattern part of the L/S pattern in each of the layers (the first layer and the second layer). In the area AR2, a second insulating film formed by SOG and Colloidal silica CS1 as precursors is embedded in the space pattern part.

Although the stack structure of two layers (N=2) alone is shown FIG. 14 and FIG. 15 for simplicity, the present invention is not limited to this. N layers (N is a natural number equal to or more than 2) can be stacked. L/S patterns in vertically adjacent layers have only to be formed across each other in the area AR1, and the space patterns have only to at least partly overlap each other in vertically adjacent layers in the area AR2. In the present embodiment, the word line WL10 and the storage element MC, the word line WL11 and the storage element MC, as well as the word line WL12 and the storage element MC correspond to, for example, an additional first pattern. The insulating film 100 in the second layer corresponds to, for example, an additional first insulating film, and SOG and the Colloidal silica CS1 in the second layer correspond to, for example, an additional second insulating film.

In the example shown in FIG. 14 and FIG. 15, line patterns Pb21 and Pb22 are also provided in the second layer in a second area, and the insulating film formed by SOG and Colloidal silica CS1 as precursors is embedded in a space pattern Sb2. However, the second layer line patterns Pb21 and Pb22 are not always needed. For example, a stack structure can also be formed by only forming the space pattern Sb1 in the first layer and simply depositing the insulating films formed by SOG and Colloidal silica CS1 as precursors in second and subsequent layers.

(b) Semiconductor Device Manufacturing Method

In a method of manufacturing the semiconductor device shown in FIG. 14 and FIG. 15, an L/S pattern is formed by patterning using lithography after a wiring material is deposited on a substrate S, and then the process described in the second embodiment has only to be repeated upward (in the Z direction). In the patterning for the second and subsequent layers, processing may reach a certain point of the lower layer or the substrate S depending on product specifications.

In general, if the insulating film formed by SOG as a precursor increases in thickness or in volume, the insulating film easily cracks because of resultant stress. However, if particulates such as colloidal silica are contained, the resistance to cracks can be improved, and the number of stacked layers can be increased. On the other hand, the insulating film formed by SOG as a precursor is only formed in the area AR1, but this insulating film is low in volume and does not crack.

When a contact hole is made in the area AR2, the diameter of this hole can be large, so that roughness resulting from the difference of etching rate between the SOG part and the particulate part is negligible. Thus, the present embodiment can simultaneously solve both the problem of the pattern roughness in the small area AR1 and the problem of the crack resistance in the large area AR2.

(5) Configuration Examples of Memory Cells

Several specific configuration examples of the memory cells MC in the second and third embodiments are described with reference to FIG. 16.

Figure 16A:
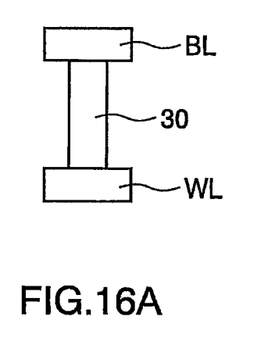
FIGS. 16A to 16E are explanatory diagrams showing several specific configuration examples of memory cells.

FIG. 16A shows a basic structure in which a storage element 30 is disposed between a word line WL and a bit line BL. The storage element 30 is, by way of example, a ferroelectric memory element, an MRAM element, a phase change memory element, or a variable resistance element. This holds true with the examples shown in FIG. 16B to 16E.

Figure 16B:
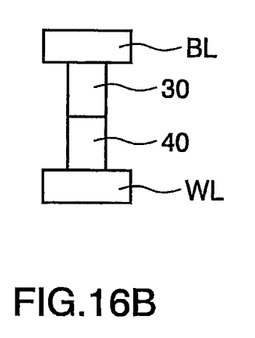

FIG. 16B shows an example in which a diode 40 intervenes between the word line WL and the storage element 30. A Schottky diode, a PN junction diode, or a PIN (or NIP) diode, for example, can be used as the diode.

Figure 16C:
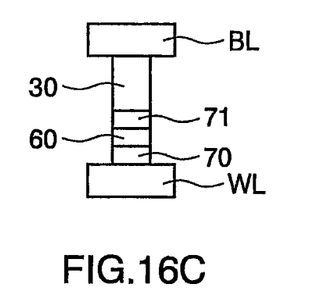
Figure 16D:
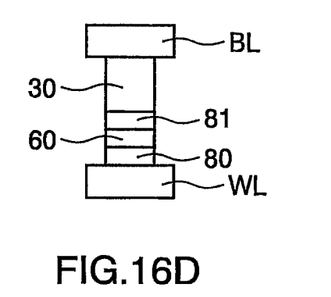

FIG. 16C shows an example in which a metal layer 70, an insulating layer 60, and a metal layer 71 intervene between the word line WL and the storage element 30. As shown in FIG. 16D, polysilicon layers 80 and 81 may be provided as conductive layers instead of the metal layers 70 and 71.

Figure 16E:
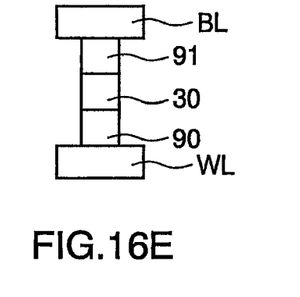

FIG. 16E shows an example in which a lower electrode 90, the storage element 30, and an upper electrode 91 are provided in order from the side of the word line WL between the word line WL and the bit line BL.

(6) Example

A semiconductor device that includes NAND-structure memory cells in a flash memory is described below as an example. First, a procedure of manufacturing the semiconductor device according to this example is described with reference to FIG. 17 to FIG. 21.

Figure 17:
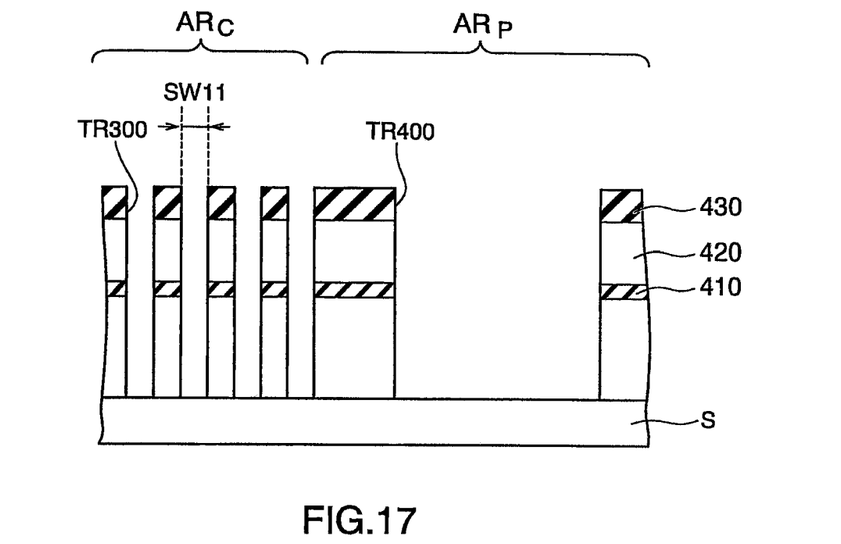
FIGS. 17 to 21 are schematic sectional views illustrating a method of manufacturing a semiconductor device according to an example.

First, a gate insulating film (having a thickness of 8 nm or less) 410 is formed by a thermal oxidation method on the surface of a silicon (Si) substrate S. On this gate insulating film, a polycrystalline silicon film having a thickness of 100 nm is formed as a first gate (floating gate) electrode film 420. The first gate electrode film 420 can also be formed by using, for example, WSi or CoSi instead of the polycrystalline silicon film, and the thickness of this film can be properly selected from 100 to 200 nm. On the first gate electrode film 420, a silicon nitride film (having a thickness of about 200 nm or less) is formed as a CMP stopper film 430 by a low-pressure CVD method. As the CMP stopper film 430, a polycrystalline silicon film having a thickness of about 100 to 200 nm may be formed instead of the silicon nitride film.

As shown in FIG. 17, shallow trench isolation (STI) trenches TR300 and TR400 are formed by photolithography and a dry etching method to reach the Si substrate S through the CMP stopper film 430, the first gate electrode film 420, and the gate insulating film 410. The width and depth of the STI trench TR300 varies with device structures and generations. Typically, the width of the trench TR300 in a cell section ARc is about 10 nm to 30 nm, and the width of the trench TR400 in a peripheral circuit section ARp is about 30 nm to several μm, and the depth thereof is about 200 nm to 500 nm. However, the present invention is not limited to this. In this example, the Si substrate S corresponds to, for example, a functional film, the TR300 corresponds to, for example, a first trench, and its width SW11 corresponds to, for example, a first width. Moreover, in this example, the cell section ARc and the peripheral circuit section ARp correspond to, for example, first and second areas, respectively.

As in the first embodiment described above, the entire surface of the Si substrate S is then coated with a coating solution including SOG and colloidal silica CS21 by the spin coating method, and the solvent is evaporated by baking. A particle diameter Dcs21 of colloidal silica CS21 is larger than a pattern width SW11 of the cell section. Here, as a fixed charge has a great influence in the NAND, it is preferable to avoid the material of organic SOG that contains carbon.

The coating film is then cured into an oxide film by a thermal treatment. When polysiloxane or silsesquioxane is used as SOG, the thermal treatment is conducted at about 300° C. to 1000° C. in a nitrogen environment. On the other hand, when polysilazane is used as SOG, the film is oxidized at about 230° C. to 900° C. in an environment containing steam, and thus transformed into an oxide film. The sidewall of the substrate is oxidized if the thermal treatment is conducted in steam. In order to avoid this, it is preferable to previously cover the sidewall with SiN or an oxide film having a small thickness of about 1 nm to 10 nm by, for example, the CVD method before the coating with the coating solution.

Figure 18:
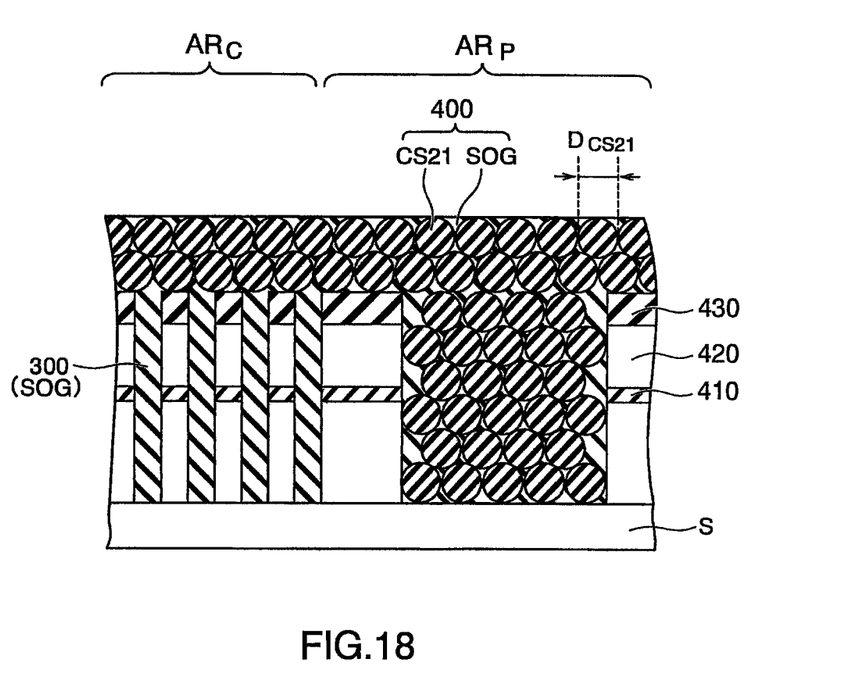

Thus, as shown in FIG. 18, a structure is formed in which an insulating film 300 formed by SOG as a precursor is embedded in the cell section ARc and in which an insulating film 400 formed by SOG and colloidal silica as precursors is embedded in the peripheral circuit section ARp. In this example, the insulating films 300 and 400 correspond to, for example, first and second insulating films, respectively.

Figure 19:
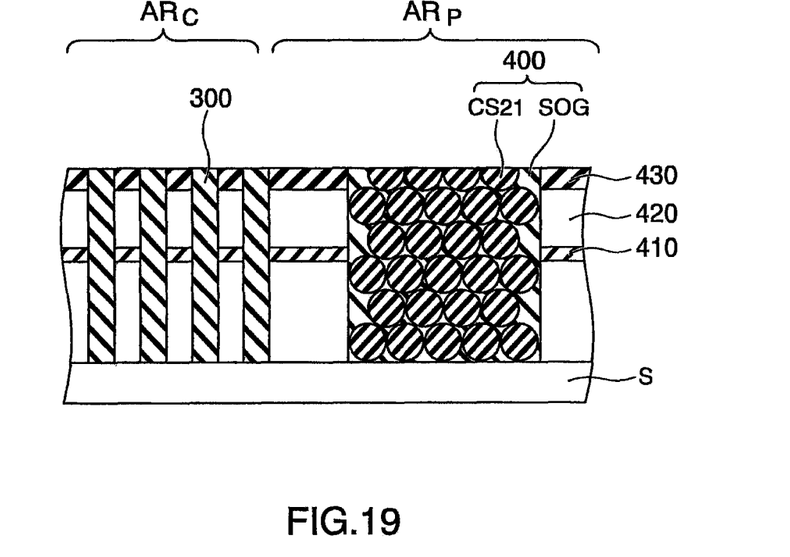
Figure 20:
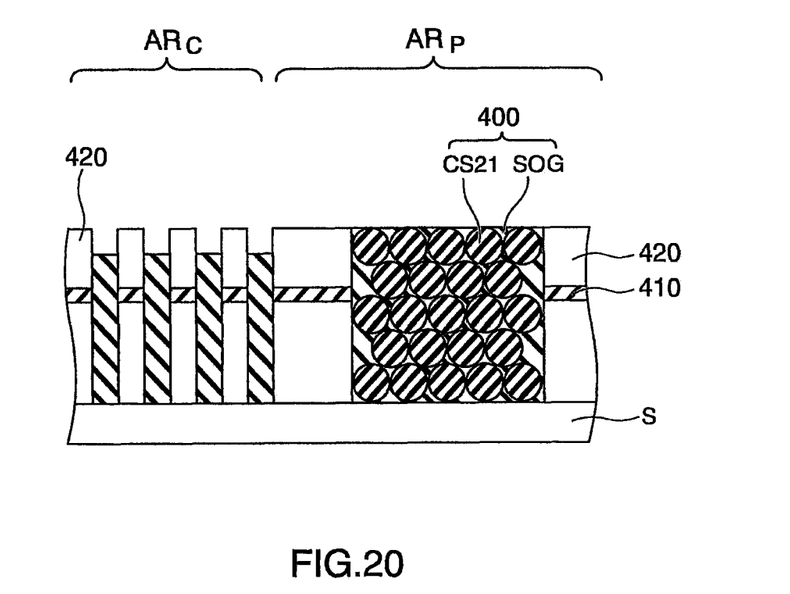

Furthermore, the insulating films 300 and 400 on the CMP stopper film 430 are selectively removed by a method such as CMP. Thus, as shown in FIG. 19, the surface of the CMP stopper film 430 is exposed, and the insulating films are left in the STI trenches TR300 and TR400.

The insulating films 300 and 400 can be densified by a thermal treatment at 400° C. or more and 1,100° C. or less in an inert gas environment in a process before or after the CMP. When polysilazane is used as SOG, it is difficult to sufficiently densify a silicon dioxide film 16 at less than 700° C. On the other hand, at more than 1,100° C., the diffusion depth of a channel layer previously formed by ion implantation may be increased in some devices. The time of the thermal treatment can be properly selected from one second to 120 minutes. If the thermal treatment is conducted in such a condition, water remaining in the insulating films is removed, so that the insulating films are densified, and the electric properties of the device can be improved accordingly.

Furthermore, the CMP stopper film 430 is removed by etching that uses a phosphoric acid solution, and in the cell section ARc, the upper part of the insulating film 300 is removed by wet etching that uses a dilute hydrofluoric acid solution. As a result, the upper part of the side surface of the first gate electrode film 420 is partially exposed about 100 nm, thereby creating the structure shown in FIG. 20. Colloidal silica CS21 is not embedded in the cell section ARc, and the insulating film 300 is a single film formed by SOG as a precursor. Therefore, the advantage is that the etching depth can be easily controlled.

Figure 21:
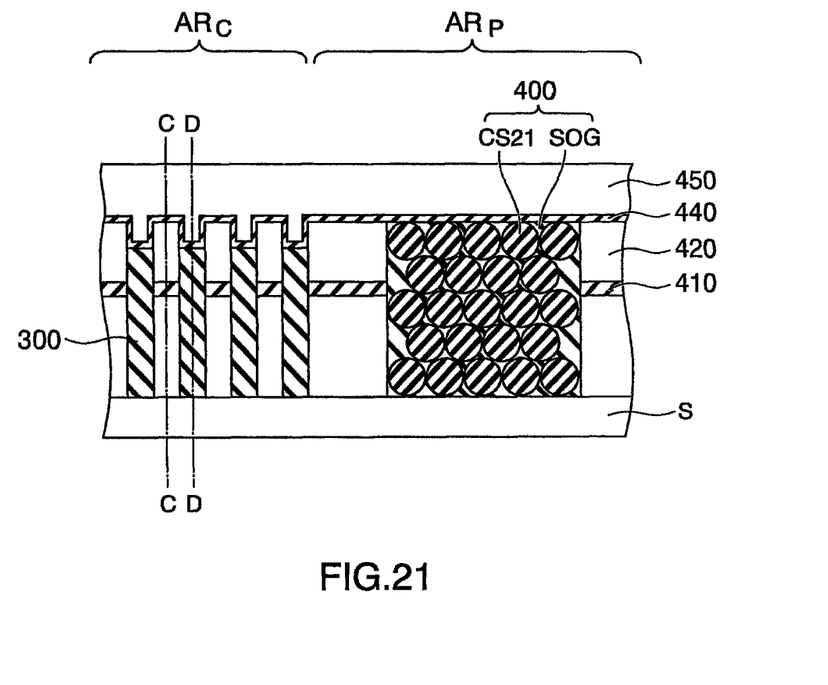

Moreover, an inter-electrode insulating film 440 is deposited by a known method, and a second gate (control gate) electrode film 450 is formed on the inter-electrode insulating film 440, thereby obtaining a memory cell having a NAND structure shown in FIG. 21. For the inter-electrode insulating film 440, a silicon oxide film/a silicon nitride film/a silicon oxide film (having a total thickness of about 20 nm) formed by the CVD method, for example, are used. For the second gate electrode film 450, a polycrystalline silicon film/a tungsten film (having a total thickness of about 50 nm) formed by the CVD method, for example, are used.

Figure 22A:
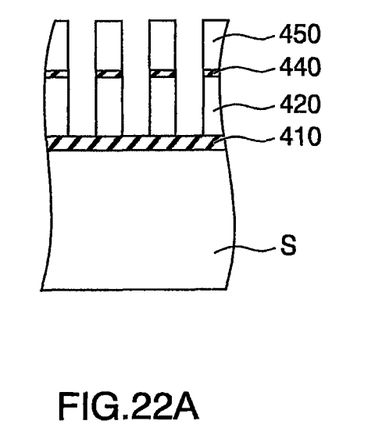
FIGS. 22A and 22B are sectional views cut along the lines in FIG. 21.
Figure 22B:
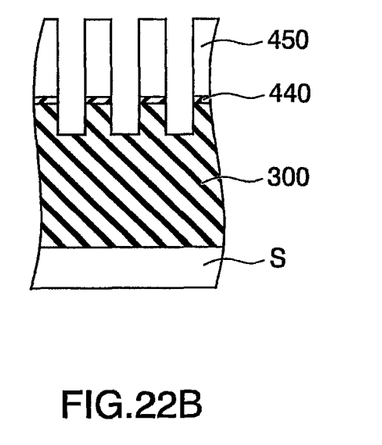

The second gate electrode film 450 and the inter-electrode insulating film 440 in the cell section ARc are processed parallel to the sheet of the drawing in FIG. 21 by lithography and dry etching, thereby forming an L/S structure in which the repetition direction of line patterns and space patterns is at right angles with the L/S shown in FIG. 17. Etching reaches the upper edge of the gate insulating film 410, and the STI is partly etched. This situation is shown in FIGS. 22A and 22B. FIG. 22A is a sectional view cut along the C-C line in FIG. 21. FIG. 22B is a sectional view cut along the D-D line in FIG. 21. In the D-D section of FIG. 22B, the STI is etched up to a certain point of the insulating film 300. However, the insulating film 300 is a single film formed by SOG as a precursor, and is therefore dimensionally controlled with ease.

On the other hand, a large number of places high in volume are formed in the peripheral circuit section ARp, as shown in FIG. 21. Therefore, according to conventional techniques, cracks may be caused by the stress of the embedded material, or crystal faults may be caused to the foundation silicon substrate S. However, according to this example, it is possible to overcome such a problem because colloidal silica CS21 is embedded.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a functional film which comprises first and second areas;
   a first trench which is provided in the first area of the functional film and which has a first width;
   a second trench which is provided in the second area of the functional film and which has a second width larger than the first width;
   a first insulating film formed from a polymeric material as a precursor to fill the first trench; and
   a second insulating film which is formed from particulates having a diameter larger than the first width and the polymeric material as precursors, the particulates filling the second trench, the polymeric material filling spaces between the particulates in the second trench and also filling gaps between the particulates and the second trench.

2. The device of claim 1, further comprising:
   a third trench which has a third width and which is provided in the first area across the first insulating film; and
   a third insulating film formed from the polymeric material as a precursor to fill the third trench.

3. The device of claim 2, further comprising:
   a storage element provided at the intersection of the first insulating film and the third insulating film between the first insulating film and the third insulating film.

4. The device of claim 3,
   wherein the storage element comprises at least one of a ferroelectric memory element, an MRAM element, a phase change memory element, and a variable resistance element.

5. The device of claim 2, further comprising:
   an additional first trench which has the first width and which is provided in the first area across the third insulating film;
   an additional third insulating film formed from the polymeric material as a precursor to fill the additional first trench;
   an additional second trench which is provided in the second area of the functional film and which has the second width;
   additional particulates which have a diameter larger than the first width and which fill the additional second trench; and
   an additional second insulating film formed from the polymeric material as a precursor, the polymeric material filling spaces between the additional particulates in the additional second trench and also filling gaps between the additional particulates and the additional second trench.

6. The device of claim 5,
   wherein the second insulating film and the additional second insulating film at least partly overlap each other in the second area when viewed in plan.

7. The device of claim 1, further comprising:
   a gate insulating film provided on the functional film;
   a first gate electrode film provided on the gate insulating film; and
   a second gate electrode film provided on the first electrode film via an inter-electrode insulating film,
   wherein the first area is a NAND memory cell area,
   the first insulating film constitutes an element separation insulating film, and
   the second area is a peripheral circuit area.

8. The device of claim 1,
   wherein the particulates are colloidal silica.

9. The device of claim 1, wherein the polymeric material comprises an Si—O bond or an Si—N bond.

* * * * *